US009536922B2

(12) United States Patent
Lai et al.

(10) Patent No.: US 9,536,922 B2

(45) Date of Patent: Jan. 3, 2017

(54) RECESS WITH ASYMMETRIC WALLS AND METHOD OF FABRICATING THE SAME

(71) Applicant: UNITED MICROELECTRONICS CORP., Hsin-Chu (TW)

(72) Inventors: Ming-Te Lai, Hsinchu (TW); Chih-Hong Wu, Changhua County (TW); Feng-Ying Hsu, Taoyuan County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/558,686

(22) Filed: Dec. 2, 2014

(65) Prior Publication Data

US 2016/0155764 A1 Jun. 2, 2016

(51) Int. Cl.

| | |
|---|---|
| ***H01L 21/84*** | (2006.01) |
| ***H01L 23/48*** | (2006.01) |
| ***H01L 27/146*** | (2006.01) |
| ***H01L 21/48*** | (2006.01) |
| ***H01L 21/311*** | (2006.01) |
| ***H01L 21/02*** | (2006.01) |

(52) U.S. Cl.

CPC ... *H01L 27/14683* (2013.01); *H01L 21/02233* (2013.01); *H01L 21/31144* (2013.01); *H01L 21/481* (2013.01); *H01L 27/14632* (2013.01); *H01L 27/14687* (2013.01)

(58) Field of Classification Search

CPC ............. H01L 21/8238; H01L 27/0922; H01L 27/11807; H01L 2027/11807; H01L 21/76897;H01L 21/8224; H01L 21/8228; H01L 21/8234; H01L 21/823885; H01L 29/0847; H01L 29/42316; H01L 29/42384; H01L 29/66

USPC ............... 257/774, 522, 419, 773, 758, 737, 499,257/762, 764, 506; 438/303, 591, 618, 421, 438/584, 637, 783, 763

See application file for complete search history.

(56) References Cited

U.S. PATENT DOCUMENTS

| | | | | |
|---|---|---|---|---|
| 6,107,206 | A * | 8/2000 | Chao et al. | 438/706 |
| 6,750,116 | B1 * | 6/2004 | Chen | H01L 21/76237 257/E21.551 |
| 2002/0100952 | A1 * | 8/2002 | Hong | 257/510 |
| 2010/0159669 | A1 * | 6/2010 | Lee | H01L 21/76232 438/424 |
| 2015/0137186 | A1 * | 5/2015 | Leidy | H01L 29/7371 257/197 |
| 2015/0206746 | A1 * | 7/2015 | Harame et al. | 257/365 |

* cited by examiner

*Primary Examiner* — Julio J Maldonado

*Assistant Examiner* — Moin Rahman

(74) *Attorney, Agent, or Firm* — Winston Hsu; Scott Margo

(57) ABSTRACT

A fabricating method of a recess with asymmetric walls includes the steps of providing a substrate comprising a top surface. A recess is formed in the substrate, wherein the recess comprises a first wall, a second wall and a bottom. A patterned mask is formed to cover the substrate. Part of the top surface adjacent to the second wall is exposed through the patterned mask. Finally, the substrate is removed to form a sloping wall, wherein the sloping wall, the first wall and the bottom form a recess with asymmetric walls.

7 Claims, 6 Drawing Sheets

W2
32
116
18
30
22
D
B
C
10
W1

RECESS WITH ASYMMETRIC WALLS AND METHOD OF FABRICATING THE SAME

BACKGROUND OF THE INVENTION

1. Field of the Invention

The present invention relates to a recess and a method of fabricating the same. More particularly, the present invention relates to a recess with asymmetric walls and a method of fabricating the same.

2. Description of the Prior Art

An image sensor is a device that converts an optical image into an electronic signal. It is most commonly used in digital cameras, camera modules and other imaging devices. Early analog sensors were video camera tubes; current sensors are semiconductor charge-coupled devices (CCD) or active pixel sensors in complementary metal-oxide-semiconductors (CMOS).

As the technology used to manufacture image sensors has continued to advance at a great pace, the demands for higher resolution and lower power consumption have encouraged the further miniaturization and integration of these image sensors. Since image quality is particularly important, the image sensor chip must provide a high quality image and have improved sensitivity.

SUMMARY OF THE INVENTION

Accordingly, the present invention provides a recess with asymmetric walls which can be a stage for an image sensor to offer better performance.

According to a first preferred embodiment of the present invention, a fabricating method of a recess with asymmetric walls includes the steps of providing a substrate comprising a top surface. A recess is formed in the substrate, wherein the recess comprises a first wall, a second wall and a bottom. After that, a patterned mask is formed to cover the substrate, wherein part of the top surface adjacent to the second wall is exposed through the patterned mask. Finally, the substrate is removed to form a sloping wall, wherein the sloping wall, the first wall and the bottom form a recess with asymmetric walls.

According to another preferred embodiment of the present invention, a fabricating method of a recess with asymmetric walls includes the steps of providing a substrate comprising a top surface. A recess is formed in the substrate, wherein the recess has a first sloping wall, a second sloping wall and a bottom. Later, a patterned mask is formed to cover the top surface, fill in the recess and expose the first sloping wall. Subsequently, the first sloping wall is removed by taking the patterned mask as a mask to form a wall perpendicular to the bottom, wherein the second sloping wall, the wall and the bottom form a recess with asymmetric walls. Finally, the patterned mask is removed.

According to another preferred embodiment of the present invention, a recess with asymmetric walls includes a substrate and a recess disposed within the substrate, wherein the recess has a sloping wall, a wall and a bottom, and the sloping wall and the wall are asymmetric.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 2, FIG. 7, FIG. 8 and FIG. 9 depict a fabricating method of a recess with asymmetric walls according to another preferred embodiment of the present invention.

FIG. 1, FIG. 2, FIG. 7, FIG. 10 and FIG. 11 depict a fabricating method of a recess with asymmetric walls according to another preferred embodiment of the present invention.

DETAILED DESCRIPTION

FIG. 1 to FIG. 7 depict a fabricating method of a recess with asymmetric walls according to a preferred embodiment of the present invention.

Figure 1:
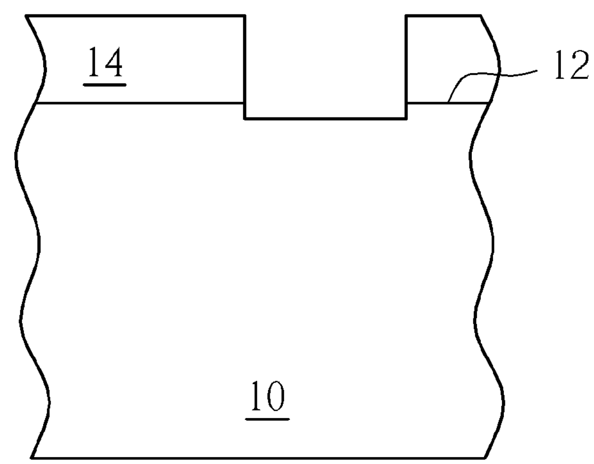
FIG. 1 to FIG. 7 depict a fabricating method of a recess with asymmetric walls according to a preferred embodiment of the present invention.
Figure 2:
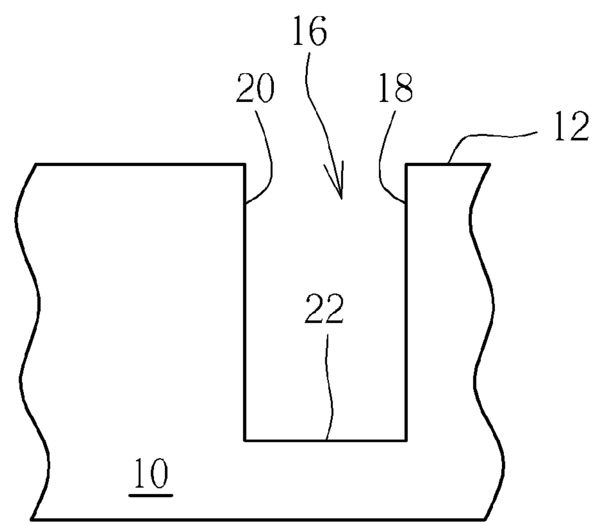

According to a first preferred embodiment of the present invention, a fabricating method of a recess with asymmetric walls includes the following steps. As shown in FIG. 1, a substrate 10 having a top surface 12 is provided. The top surface 12 is covered by a patterned mask layer 14. The patterned mask layer 14 may be made of silicon oxide, silicon nitride, photoresist or other materials. The patterned mask layer 14 includes a recess pattern thereon. The substrate 10 may be a bulk silicon substrate, a germanium substrate, a gallium arsenide substrate, a silicon germanium substrate, an indium phosphide substrate, a gallium nitride substrate or a silicon carbide substrate. As shown in FIG. 2, a recess 16 is formed within the substrate 10 by taking the patterned mask layer 14 as a mask. The recess 16 includes a first wall 18, a second wall 20 and a bottom 22. The first wall 18 is symmetric to the second wall 20. Furthermore, both the first wall 18 and the second wall 20 are straight or linear. Moreover, the first wall 18 and the second wall 20 are connected to the top surface 12, respectively. Preferably, the first wall 18 is perpendicular to the bottom 22 and the second wall 20 is also perpendicular to the bottom 22, but the embodiment is not limited therein. The top surface 12 is adjacent to the first wall 18 and the second wall 20. After the recess 16 is formed, the patterned mask layer 14 is removed.

Figure 3:
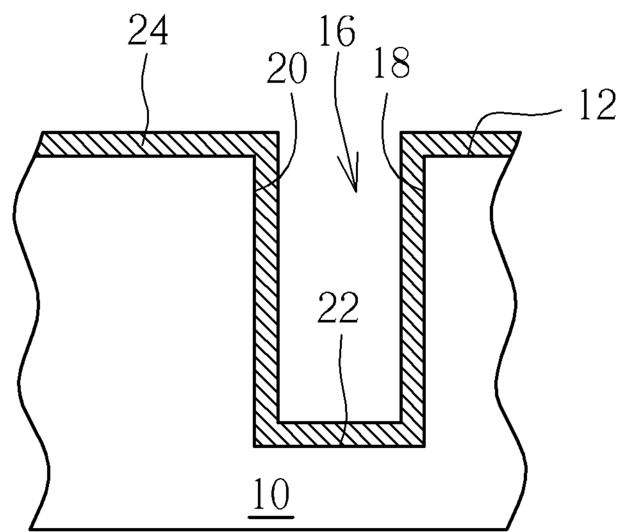
Figure 4:
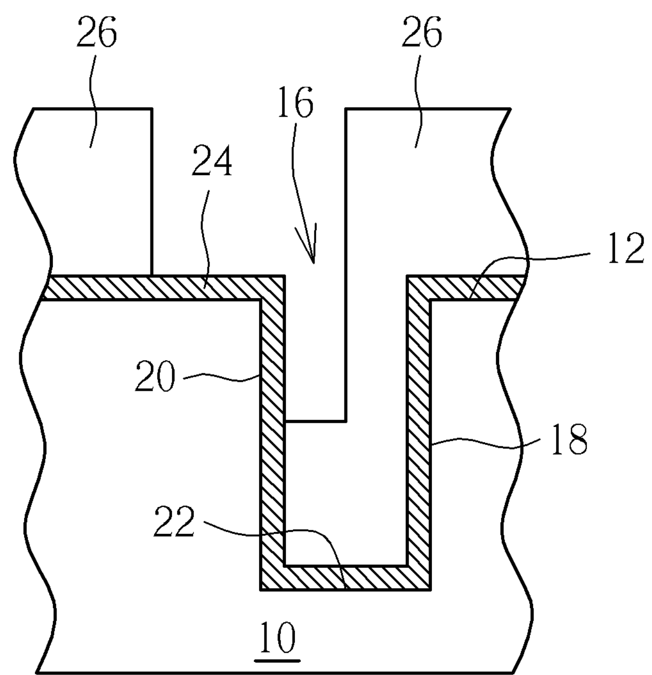

As shown in FIG. 3, an oxide layer 24 is conformally formed on the top surface 12, the first wall 18, the second wall 20 and the bottom 22. The oxide layer 24 may be formed by oxidizing the substrate 10 or by using an oxide deposition process. The oxide layer 24 is preferably silicon oxide. Later, a mask layer (not shown) is formed blankly on the top surface 12 of the substrate 10 and fills in the recess 16. The mask layer contacts the oxide layer 24. After that, as shown in FIG. 4, part of the mask layer is removed to expose the oxide layer 24 on the top surface 12 adjacent to the second wall 20, and expose part of the oxide layer 24 on the second wall 20 so as to form a patterned mask 26. The exposed oxide layer 24 on the top surface 12 is connected to the exposed oxide layer 24 on the second wall 20.

Figure 5:
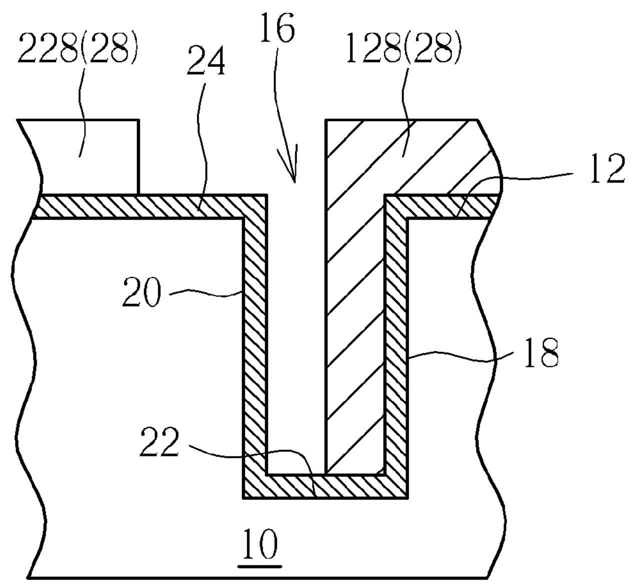

Refer to FIG. 5. The patterned mask 26 is further removed to form a patterned mask 28. The patterned mask 28 may be a photoresist. The oxide layer 24 on the bottom 22, on the second wall 20 and on the top surface 12 adjacent to the second wall 20 is exposed through the patterned mask 28. The patterned mask includes a reverse L shaped structure (marked by slashes). The reverse L shaped structure is disposed in the recess 16, but does not fill up the recess 16. More specifically, the patterned mask 28 includes two parts 128/228, and the two parts 128/228 are disconnected to each other. One part 228 is only disposed on the top surface 12. The other part 228 is disposed on the top surface 12, extends to the first wall 18 and extends to part of the bottom 22 of the recess 16.

Figure 6:
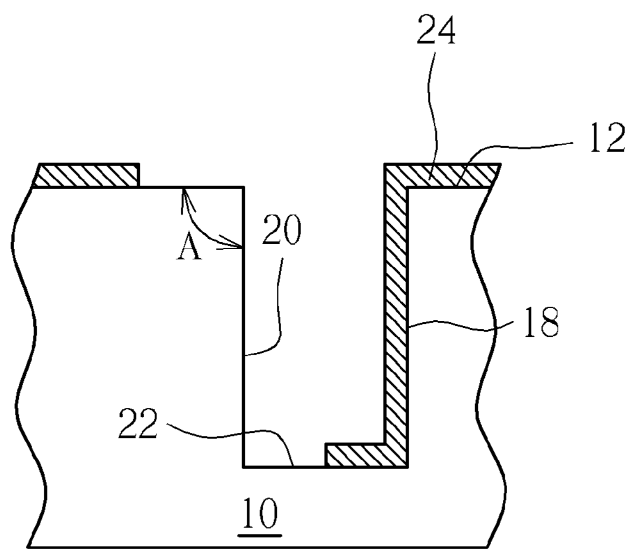
Figure 7:
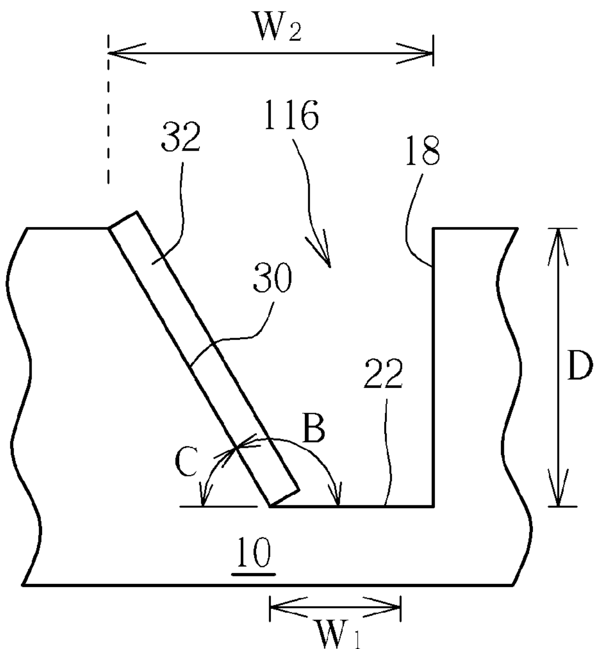

As shown in FIG. 5 and FIG. 6, the exposed oxide layer 24 is removed by taking the patterned mask 28 as a mask to expose part of the top surface 12 adjacent to the second wall 20, and expose the second wall 20 of the recess 16. The exposed top surface 12 and the exposed second wall 20 form an angle A. The angle A is preferably a right angle. Later, the patterned mask 28 is removed and the oxide layer 24 originally beneath the patterned mask 28 is exposed. As shown in FIG. 7, the angle A is removed to form a sloping wall 30 by taking the oxide layer 24 as a mask. According to a preferred embodiment of the present invention, as lasers used on the present invention can be stopped by silicon oxide, the angle A is removed by a laser taking the oxide layer 24 as a mask. After the sloping wall 30 is formed, the oxide layer 24 is entirely removed. At this point, the sloping wall 30, the bottom 22, and the first wall 18 forming a recess 116 with asymmetric walls is completed.

Continue to refer to FIG. 7. A recess 116 with asymmetric walls is provided. The recess 116 with asymmetric walls is disposed in a substrate 10. The substrate 10 may be a bulk silicon substrate, a germanium substrate, a gallium arsenide substrate, a silicon germanium substrate, an indium phosphide substrate, a gallium nitride substrate or a silicon carbide substrate. The recess 116 with asymmetric walls includes a sloping wall 30, a first wall 18 and a bottom 22. Both the sloping wall 30 and the first wall 18 are straight or linear. An angle B is between the sloping wall 30 and the bottom 22. According to a preferred embodiment of the present invention, the angle B is between 125 and 129 degrees. A supplementary angle C of angle B is between 51 and 55 degrees. A width $W_1$ of the bottom is between 0.7 to 1 micro meters. A width $W_2$ of an opening of the recess 116 with asymmetric walls is between 2.6 and 2.9 micro meters. A depth D of the recess with asymmetric walls is between 1.3 and 1.7 micro meters. A chip 32 including at least one CMOS image sensor or other kinds of image sensor can be disposed on the sloping wall 30 of the recess 116. The chip 32, and the substrate 10 having the recess 116 with asymmetric walls will be packaged together to form an image device. The image device may be attached to wearable devices such as clothing, hats, or accessories so as to project images to a desired position. The sloping wall can support the image sensor to project an image.

The recess with asymmetric walls in FIG. 7 can be formed by another fabricating method. FIG. 1, FIG. 2, FIG. 7, FIG. 8 and FIG. 9 depict a fabricating method of a recess with asymmetric walls according to another preferred embodiment of the present invention, wherein like reference numerals are used to refer to like elements throughout.

Figure 8:
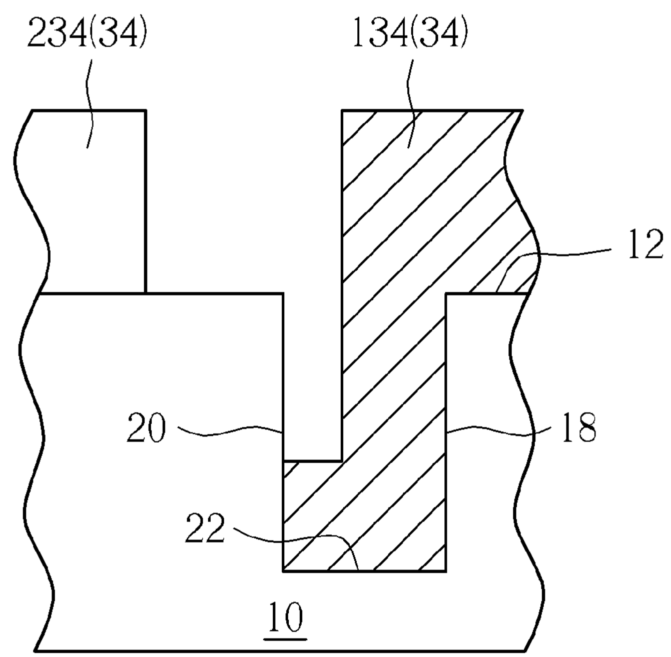

Refer to FIG. 1 and FIG. 2. A substrate 10 is provided. A recess 16 having a first wall 18, a second wall 20 and a bottom 22 is formed in the substrate 10. Refer to the above description regarding FIG. 1 and FIG. 2 for details of the fabricating process in these steps. As shown in FIG. 8, a mask layer (not shown) is formed on the top surface 12 of the substrate 10 and fills in the recess 16. After that, part of the mask layer is removed to form a patterned mask 34. The patterned mask 34 may be a photoresist. Part of the top surface 12 is exposed through the patterned mask 34. Other parts of the top surface 12 are still covered by the patterned mask 34. The patterned mask 34 includes two parts 134/234, and the two parts 134/234 are disconnected to each other. One part 234 of the patterned mask 34 is only disposed on the top surface 12. The other part 134 of the patterned mask 34 is disposed on the top surface 12, extends to the first wall 18, the second wall 20 and extends to the entire bottom 22. The exposed top surface 12 is between the two parts 134/234 of the patterned mask 34.

Figure 9:
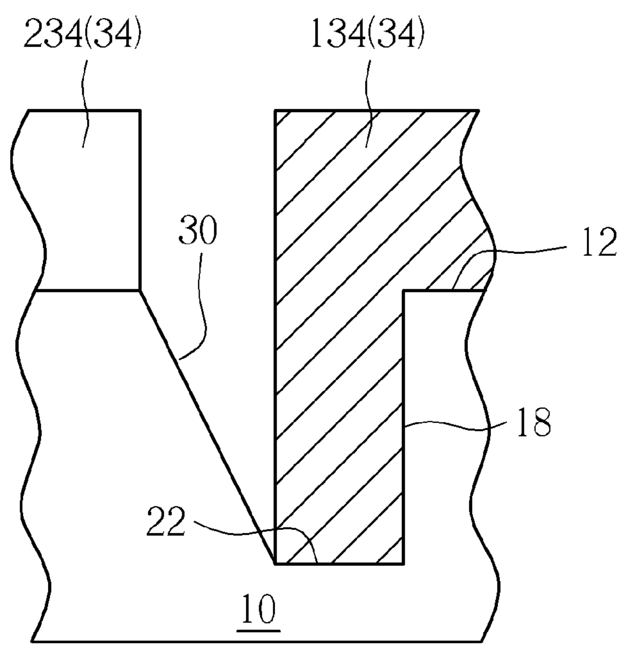

As shown in FIG. 9, the exposed top surface 12 is etched by an etching process, such as a dry etching or a wet etching to form a sloping wall 30. The sloping wall connects to the bottom 22, and connects to the top surface 12 still covered by the patterned mask. The sloping wall 30 is straight or linear.

As shown in FIG. 7, the patterned mask 34 is removed. As this point, the recess 116 with asymmetric walls of the present invention is completed. Please refer to the previous paragraphs for the explanation of the recess 116 with asymmetric walls in FIG. 7.

Although previous embodiments only disclose to change the second wall 20 to the sloping wall 30, however, one skilled in the art can use the same method describe in the present invention to make the first wall 20 to the sloping wall 30.

Figure 10:
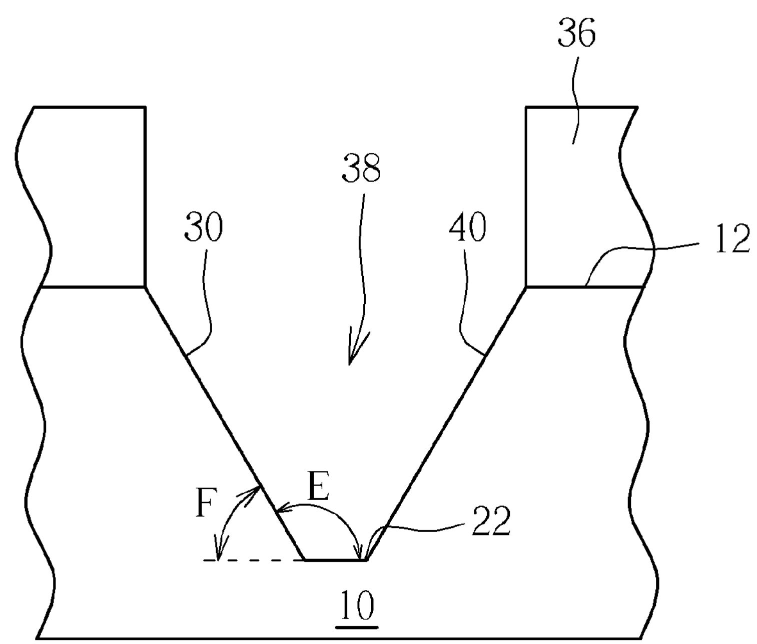
Figure 11:
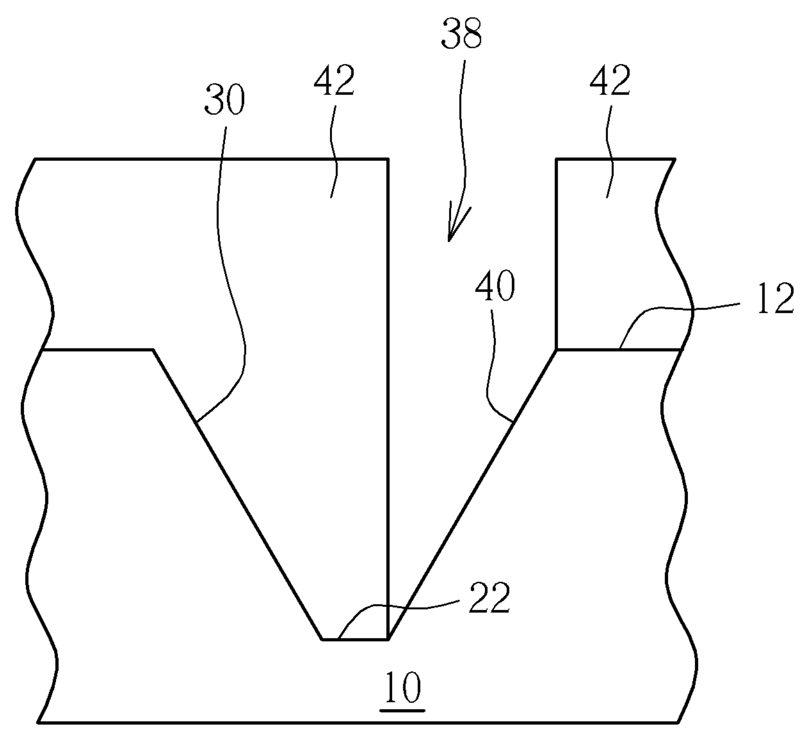

The recess with asymmetric walls in FIG. 7 can be formed by yet another fabricating method. FIG. 7, FIG. 10 and FIG. 11 depict a fabricating method of a recess with asymmetric walls according to yet another preferred embodiment of the present invention, wherein like reference numerals are used to refer to like elements throughout.

As shown in FIG. 10, a substrate 10 is provided. The substrate 10 includes a top surface 12. The substrate 10 may be a bulk silicon substrate, a germanium substrate, a gallium arsenide substrate, a silicon germanium substrate, an indium phosphide substrate, a gallium nitride substrate or a silicon carbide substrate. The top surface 12 of the substrate 10 is covered by a patterned mask such as a patterned photoresist 36. There may be a silicon oxide layer or silicon nitride layer disposed between the substrate 10 and the patterned photoresist 36. The substrate 10 is etched to form a recess 38 followed by removing the patterned photoresist 36. The recess 38 includes a sloping wall 30, a sloping wall 40, and a bottom. 22 An angle E is between the sloping wall 30 and the bottom 12. The angle E is between 125 and 129 degrees. A supplementary angle F of angle E is between 51 and 55 degrees.

As shown in FIG. 11, a patterned mask 42 is formed to cover the top surface 12 and fill in the recess 38. The sloping wall 40 is exposed through the patterned mask 42. As shown in FIG. 7, the sloping wall 40 is removed by taking the patterned mask 42 as a mask to form a first wall 18 which is preferably perpendicular to the bottom 22. Then, the patterned mask 42 is removed. At this point, the recess 116 with asymmetric walls of the present invention is completed. Please refer to the previous paragraph for the explanation of the recess with asymmetric walls in FIG. 7.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a recess with asymmetric walls, comprising:

providing a substrate comprising a top surface;

forming a recess in the substrate, wherein the recess comprises a first wall, a second wall and a bottom;

forming a patterned mask covering the substrate, and the patterned mask filling in the recess partly, wherein the patterned mask layer at least covers the bottom and the first wall and wherein part of the top surface connecting to the second wall is exposed through the patterned mask; and removing the substrate by taking the patterned mask layer as a mask to form a sloping wall, wherein the sloping wall, the first wall and the bottom form a recess with asymmetric walls.

2. The fabricating method of a recess with asymmetric walls of claim 1, further comprising:

after forming the recess, oxidizing the substrate to form an oxide layer conformally on the top surface and the recess;

forming a mask layer filling up the recess and covering the top surface;

removing part of the mask layer to expose part of the oxide layer on the second wall and expose part of the oxide layer on the top surface; and removing part of the mask layer to expose part of the oxide layer on the bottom to form the patterned mask, wherein the patterned mask covers the first wall entirely and the bottom partly and the second wall is exposed through the patterned mask entirely.

3. The fabricating method of a recess with asymmetric walls of claim 2, further comprising:

after forming the patterned mask, removing the exposed oxide layer to expose the top surface and the second wall, wherein the exposed top surface and the exposed second wall define an angle;

removing the patterned mask;

taking the remaining oxide layer as a mask to remove the angle by a laser so as to form the sloping wall; and removing the oxide layer entirely.

4. The fabricating method of a recess with asymmetric walls of claim 1, further comprising:

after forming the recess, forming a mask layer filling up the recess and covering the top surface;

removing part of the mask layer to form the patterned mask, wherein the patterned mask layer covers the first wall entirely, the bottom entirely and the second wall partly;

removing the substrate to form the sloping wall by a dry etching process and taking the patterned mask as a mask; and removing the patterned mask.

5. The fabricating method of a recess with asymmetric walls of claim 1, wherein an angle between the sloping wall and the bottom is between 125 and 129 degrees.

6. The fabricating method of a recess with asymmetric walls of claim 1, wherein the first wall and the second wall are symmetric.

7. A fabricating method of a recess with asymmetric walls, comprising:

providing a substrate comprising a top surface;

forming a recess in the substrate, wherein the recess comprises a first wall, a second wall and a bottom;

forming a patterned mask covering the substrate, and the patterned mask filling in the recess partly, wherein the patterned mask layer at least covers the bottom and the first wall and wherein part of the top surface connecting to the second wall is exposed through the patterned mask; and after forming the recess, removing the substrate by taking the patterned mask layer as a mask to form a sloping wall, wherein the sloping wall, the first wall and the bottom form a recess with asymmetric walls.

* * * * *